United States Patent [19]

Nakajima

[11] Patent Number: 5,436,470
[45] Date of Patent: Jul. 25, 1995

[54] FIELD EFFECT TRANSISTOR

[75] Inventor: Shigeru Nakajima, Yokohama, Japan

[73] Assignee: Sumitomo Electric Industries, Ltd., Japan

[21] Appl. No.: 818,537

[22] Filed: Jan. 9, 1992

[30] Foreign Application Priority Data

Jan. 14, 1991 [JP] Japan .................. 3-002789
Jan. 14, 1991 [JP] Japan .................. 3-002790
Jan. 14, 1991 [JP] Japan .................. 3-002791
Jan. 14, 1991 [JP] Japan .................. 3-002792

[51] Int. Cl.[6] .................. H01L 29/161; H01L 29/205
[52] U.S. Cl. .................. 257/24; 257/20; 257/27; 257/194
[58] Field of Search .................. 257/20, 24, 27, 194, 257/192

[56] References Cited

U.S. PATENT DOCUMENTS 4,833,508 5/1989 Ishikawa et al. .................. 257/24
5,091,759 2/1992 Shih et al. .................. 257/194

FOREIGN PATENT DOCUMENTS 0214047 11/1987 European Pat. Off. .
61-23364 1/1986 Japan .................. 257/194
1-268070 10/1989 Japan .................. 257/14

OTHER PUBLICATIONS

"Parametric Analysis of GaInAs Devices For MM—Wave Applications," A. R. Jha, *International Journal of Infrared and Millimeter Waves*, vol. 10, No. 10, Oct. 1989, New York US pp. 1181–1191.

"A 10-Gbit/s Laser Driver IC With i-AlGaAs/-n-GaAs Doped-Channel Hetero-MISFETs (DMTs)," Suzuki et al., *Proceedings 11th GAAS IC Symposium*, IEEE, San Diego, Calif., US, 22–25 Oct. 1989 pp. 129–132.

"AlGaAs/In GaAs/GaAs Quantum-Well Power MISFET at Millimeter-Wave Frequencies," Kim et al., *IEEE Electron Device Letters*, vol. 9, No. 11, Nov. 1988, New York US pp. 610–612.

*Primary Examiner*—Jerome Jackson
*Assistant Examiner*—Don Monin
*Attorney, Agent, or Firm*—Beveridge, DeGrandi, Weilacher & Young

[57] ABSTRACT

The invention provides a FET by forming a channel layer in layer including "n" type impurity at high concentration, which is sandwiched by a first semiconductor layer and a second semiconductor layer lightly doped with impurity. Therefore even when electrons in the channel layer obtain high energy, the electrons in this arrangement rush out essentially to the second semiconductor layer excelling in electron carrying characteristic, thus a travelling speed of the electrons in the channel layer is not lowered. Furthermore the channel layer being formed in layer and allowed to include impurity at high concentration, the current drive capability can be improved.

21 Claims, 9 Drawing Sheets

PRIOR ART

PRIOR ART

PRIOR ART

FIELD EFFECT TRANSISTOR

BACKGROUND OF THE INVENTION

1. Field of the Invention

The present invention relates to a structure of a field effect transistor (FET) necessitating a very high speed operation.

2. Related Background Art

Conventionally, as a very high speed device of this kind, for example, a first HEMT (high electronmobility transistor) is introduced as shown in FIG. 1. An InP semiconductor substrate 1 is formed thereon with an undoped InP layer 2. The undoped InP layer 2 is formed thereon with an n-$Al_xIn_{1-x}As$ layer 3 on which donors are selectively added to $Al_xIn_{1-x}As$. The n-$Al_xIn_{1-x}As$ layer 3 is formed thereon with an n+-InGaAs layer 4, a gate electrode 5 is formed in Schottky contact with the n-$Al_xIn_{1-x}As$ layer 3 exposed at a recess formed at a center portion, and ohmic electrodes 6 and 7 are formed on the n+-InGaAs layer 4.

There is also a second HEMT having the same structure as the first HEMT but made of different composite materials. In the second HEMT, a GaAs semiconductor substrate is used instead of the InP semiconductor substrate 1, and an undoped GaAs layer, an n-AlGaAs layer, and an n+-GaAs layer are laminated respectively instead of the undoped InP layer 2, the n-$Al_xIn_{1-x}As$ layer 3, and the n+-InGaAs layer 4.

There is also a third HEMT with a structure as indicated in FIG. 2. Namely, an InP semiconductor substrate 11 is formed thereon with an undoped AlInAs layer 12. On the undoped AlInAs layer 12 is further formed an undoped $In_yGa_{1-y}As$ layer 13 and on this undoped $In_yGa_{1-y}As$ layer 13 is formed an n-$Al_xIn_{1-x}As$ layer 14 in which donors are selectively added to $Al_xIn_{1-x}As$. Further on the n-$Al_xIn_{1-x}As$ layer 14 is formed an n+-InGaAs layer 15, and a gate electrode 16 is formed in Schottky contact with the n-$Al_xIn_{1-x}As$ layer 14 exposed at a recess formed at a center portion, and ohmic electrodes 17 and 18 are formed on the n+-InGaAs layer 15.

In addition, there is a fourth HEMT having the same structure as the third HEMT but with different composite materials. In the fourth HEMT, a GaAs semiconductor substrate is used instead of an InP semiconductor substrate 11, and an undoped GaAs layer, an undoped $In_yGa_{1-y}As$ layer, and an n-$Al_xGa_{1-x}As$ layer are laminated respectively instead of the undoped AlInAs layer 12, the undoped $In_yGa_{1-y}As$ layer 13, and the n-$Al_xIn_{1-x}As$ layer 14. The donors are selectively added to this n-$Al_xGa_{1-x}As$ layer. Further an n+-InGaAs layer is used instead of the n+-InGaAs layer 15.

However, as in the conventional first HEMT of the prior art hereinbefore described, for a system using heterojunction of AlInAs/InP, electrons travel in an InP layer being a channel and such electrons often produce a real space transfer for making transition to the AlInAs layer disposed in the upper layer of the InP layer. This real space transfer may be explained as follows. An energy band indicated in FIG. 3 is formed at a heterojunction portion of the n-AlInAs layer 3 and the undoped InP layer 2, and the two-dimensional electron gas is accumulated at the oblique-lined portion of the drawing. However, if a high electric field is applied across a drain and a source and energy of the two-dimensional electron gas becomes higher, the electrons in the two-dimensional electron gas make transition to the n-AlInAs layer 3 as shown by the arrow mark in the drawing.

Generally, a high electric field is applied across a drain and a source during its operation, and as carrying characteristic of electrons is inferior in the AlInAs layer than in the InP layer, when this real space transfer occurs the high-frequency characteristic of FET becomes degraded.

As in the second HEMT of the prior art hereinbefore described, for a system using the heterojunction of AlGaAs/GaAs, electrons travel in an GaAs layer which is to become a channel and such electrons sometimes produce a real space transfer for making transition to the AlGaAs layer disposed in the upper layer of the GaAs layer. For example, this real space transfer may be explained as follows. An energy band in FIG. 4 is formed at the heterojunction portion of the n-AlGaAs layer and the undoped GaAs, and the two-dimensional electron gas is accumulated at the oblique lined portion of the drawing. However, if a high electric field is applied across a drain and a source and energy of the two-dimensional electron gas becomes higher, the electrons in the two-dimensional electron gas are transferred to the n-AlGaAs layer as shown by arrow mark in the drawing.

Generally, a high electric field is applied across a drain and a source during its operation, and as carrying characteristic of electrons is inferior in the AlGaAs layer than in the GaAs layer, thus when this real space transfer occurs it deteriorates the high-frequency characteristic of FET.

In addition, as in the third HEMT of the prior art hereinbefore described, even in a system using the heterojunction of AlInAs/InGaAs, electrons travel in an InGaAs layer 13 which is to become a channel and such electrons sometimes produce real space transfer for making transition to the AlInAs layer 14 disposed in the upper layer of the InGaAs layer 13. This real space transition may be explained as below. An energy band in FIG. 5 is formed at the heterojunction portion of the n-AlInAs layer 14 and the undoped InGaAs layer 13, and the two-dimensional electron gas is accumulated at oblique lined portion of the drawing. However, if a high electric field is applied across a drain and a source and energy of the two-dimensional electron gas becomes higher, the electrons in the two-dimensional electron gas are transferred to the n-AlInAs layer 14 as shown by arrow mark in the drawing.

Generally, a high electric field is imposed across a drain and a source during its operation, and because carrying characteristic of electrons in the AlInAs layer is inferior to that of the InGaAs layer, when this real space transfer occurs, it deteriorates the high-frequency characteristic of FET.

Also as in the fourth HEMT of the prior art hereinbefore described, even for a system using the heterojunction of AlGaAs/InGaAs, electrons travel in an InGaAs layer which will be a channel and such electrons sometimes produce real space transition for transferring to the AlGaAs layer disposed in the upper layer of the InGaAs layer. This real space transfer can be explained as follows. An energy band in FIG. 6 is formed at the heterojunction portion of the n-AlGaAs layer and the undoped InGaAs layer, and the two-dimensional electron gas is accumulated at the oblique lined portion of the drawing. However, if a high electric field is applied across a drain and a source and energy of the two-dimensional electron gas becomes higher, the electrons in the two-dimensional electron gas make transition to the n-AlGaAs layer as shown by arrow mark in the drawing.

Generally, a high electric field is applied across a drain and a source during its operation, and because carrying characteristic of electrons in the AlInAs layer is inferior than in the InGaAs layer, when a real space transfer occurs, it deteriorates the high-frequency characteristic of FET.

The first HEMT of the prior art abovementioned uses as a channel a two-dimensional electron gas layer 8 in FIG. 1 produced on a heterojunction interface between the undoped InP layer 2 and the n-AlInAs layer 3. This channel is formed within InP having a higher electron saturating speed than GaAs or InGaAs, thus producing a high-frequency device with upgraded performance. However, a limit has been placed against raising the electron gas density because maximum current density of such HEMT is determined by the upper limit of two-dimensional electron gas density and the channel layer being in two-dimensional status. This results in an inability to produce a high-frequency device exhibiting a satisfactorily large output.

The fact as hereinbefore described applies also to the conventional cases of the second, third, and fourth HEMTs of the prior art. Electron gas density cannot be satisfactorily increased by the conventional second HEMT because the second HEMT uses as a channel a two-dimensional electron gas layer produced on a heterojunction interface between the undoped GaAs layer and the n-AlGaAs layer. Also, the electron gas density is not fully raised by the conventional third HEMT because the third HEMT uses as its channel a two-dimensional electron gas layer 19 in FIG. 2 produced on a heterojunction interface between the undoped InGaAs layer 13 and the n-AlInAs layer 14, as well as by the conventional fourth HEMT because the fourth HEMT uses as its channel a two-dimensional electron gas layer produced on a heterojunction interface between the undoped InGaAs layer and the n-AlGaAs layer. Therefore high-frequency devices with a sufficiently high output have not been produced by the respective conventional HEMTs described above.

For other very high speed devices there has been developed, for example, a DMT (Doped-channel hetero MIS-FET) with the structures as in FIG. 7. A GaAs semiconductor substrate 21 is formed thereon an undoped GaAs layer 22, on which is formed an n+-GaAs layer 23 that will be a channel. Further, on the n+-GaAs layer 23 is formed an undoped AlGaAs layer 24 and an n+-GaAs layer 25. A gate electrode 26 is formed in Schottky contact with an undoped AlGaAs layer 24 exposed at a recess, and ohmic electrodes 27 and 28 are formed on the n+-GaAs layer 25.

Because such DMT uses a high density and thinly formed n+-GaAs layer 23 as a channel layer, a sufficiently large output can be obtained. The AlGaAs layer 24 thereabove is undoped to improve its Schottky withstanding voltage. However in this DMT, because channel layer contains a large amount of impurities the travelling speed of electrons in the channel layer is lowered comparing with that of HEMT. As a result a high-frequency operational characteristic of DMT was inferior to that of HEMT.

Furthermore, as the DMT, as in the case of the second HEMT hereinbefore described, uses heterojunction of the AlGaAs/GaAs, the electrons travelling in the n+-GaAs layer 23 that will be a channel, are sometimes in real spatial transition to the AlGaAs layer 24 disposed in the upper layer of the n+-GaAs layer 23. Thus due to this real spatial transition there is a case where the high-frequency characteristic of FET is further degraded.

SUMMARY OF THE INVENTION

The present invention is made to solve such problems, and to form a field effect transistor (FET) comprising: a first semiconductor layer; a channel layer having a crystalline structure substantially lattice-matching the first semiconductor layer, the channel layer being thinly formed containing an "n" type impurity at a high concentration; a second semiconductor layer having a crystalline structure substantially lattice-matching the channel layer, the second semiconductor layer being lightly doped with impurity made of materials with a higher electron carrying characteristic than that of the channel layer; and a third semiconductor layer in heterojunction with the second semiconductor layer, the third semiconductor layer being lightly doped with impurity and in Schottky contact with a gate electrode.

In a FET of the structure in accordance with the present invention, if a higher electric field is applied across the drain and the source, electrons which travel in the channel layer including impurity at a high concentration obtain energy. Thus the electrons rush out to the first semiconductor layer and the second semiconductor layer both sandwiching the channel layer, to essentially travel in the second semiconductor layer excelling in electron carrying characteristic.

Because the channel layer is allowed to contain a high concentration of impurity the channel is formed by a large amount of electrons.

For this reason, according to the present invention a FET excelling in current driving function can be obtained without lowering the speed of electron travelling in a channel.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENT

Figure 1:
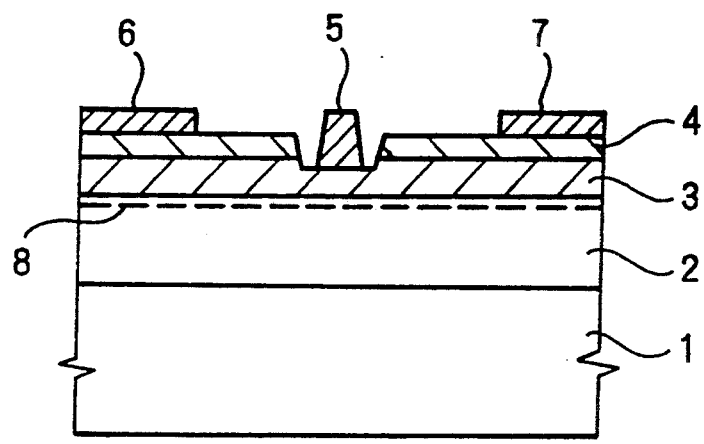
FIG. 1 is a sectional view of conventional first and second HEMTs respectively.
Figure 2:
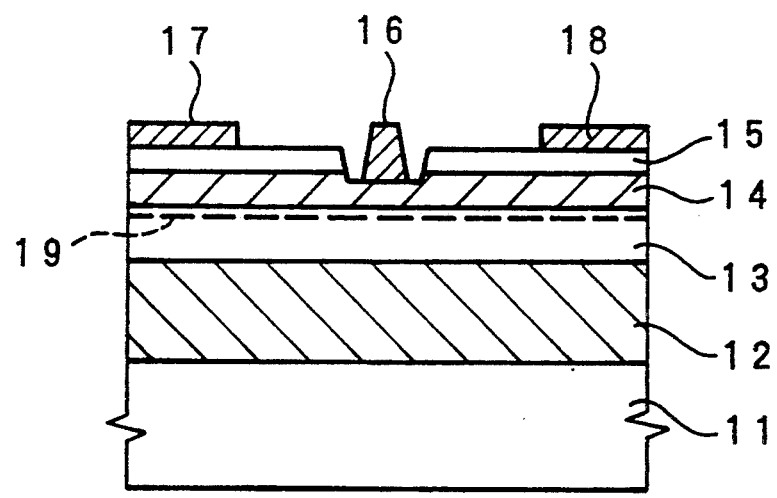
FIG. 2 is a sectional view of conventional third and fourth HEMTs respectively.
Figure 3:
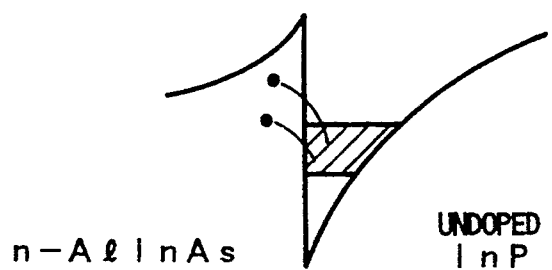
FIG. 3 is an energy band profile illustrating a real space transition in a heterojunction of AlInAs/InP system of the first HEMT in the prior art.
Figure 4:
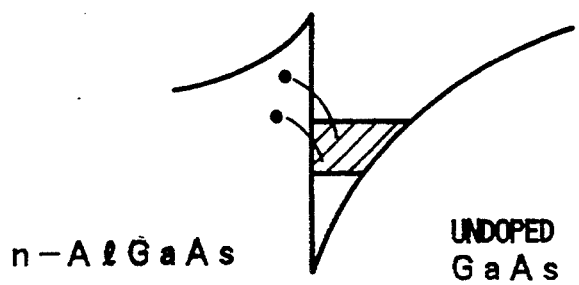
FIG. 4 is an energy band profile illustrating a real space transition in a heterojunction of AlGaAs/GaAs system of the second HEMT in the prior art.
Figure 5:
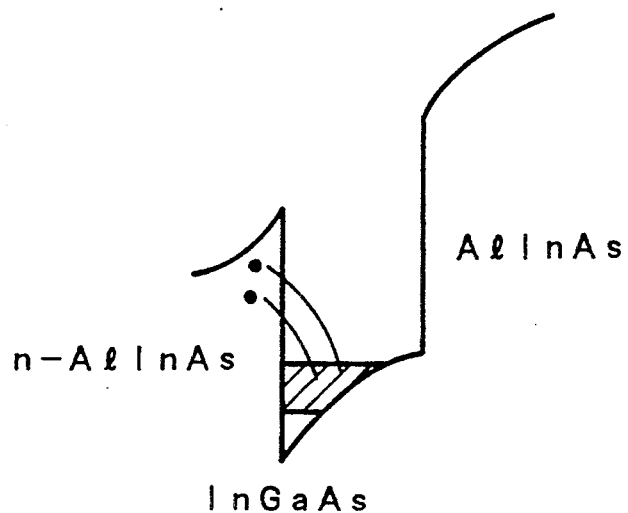
FIG. 5 is an energy band profile illustrating a real space transition in a heterojunction of AlInAs/InGaAs system of the third HEMT in the prior art.
Figure 6:
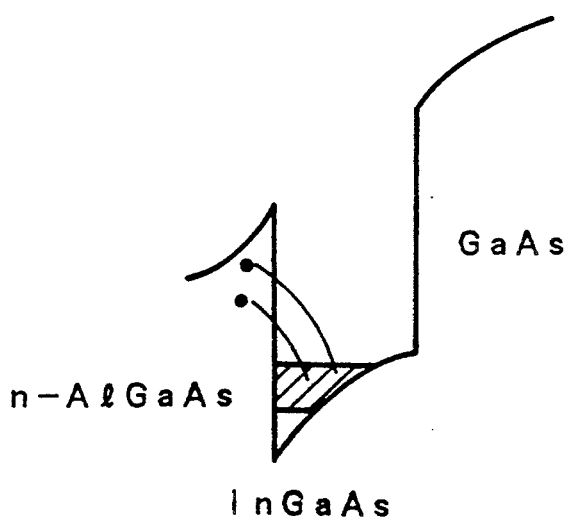
FIG. 6 is an energy band profile illustrating a real space transition in a heterojunction of AlGaAs/InGaAs system of the fourth HEMT in the prior art.
Figure 7:
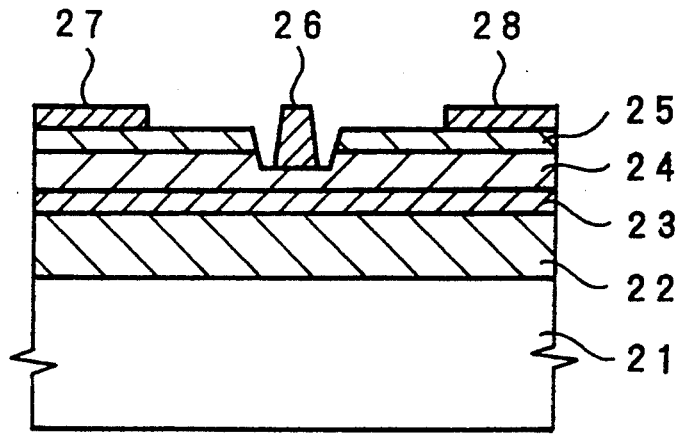
FIG. 7 is a sectional view showing a conventional DMT.
Figure 8:
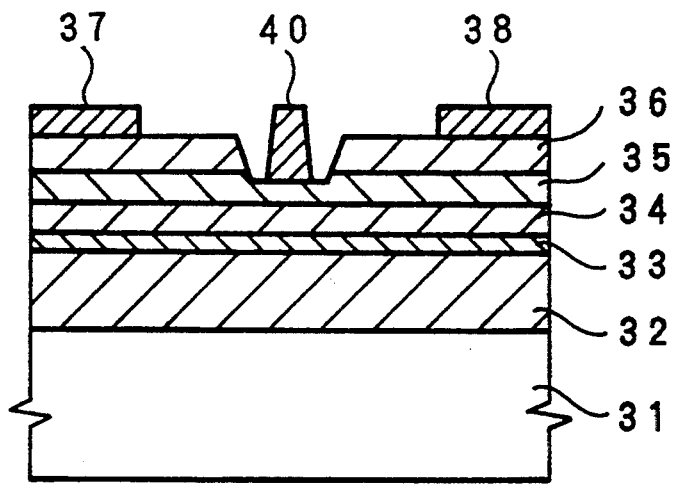
FIG. 8 is a sectional view of a FET with reference to first and the second embodiments according to the present invention.

FIG. 8 shows a structure of a FET according to a first embodiment of the present invention. A method of producing the same is shown by a sectional view of processing steps in FIG. 9, which is described below.

Figure 9A:
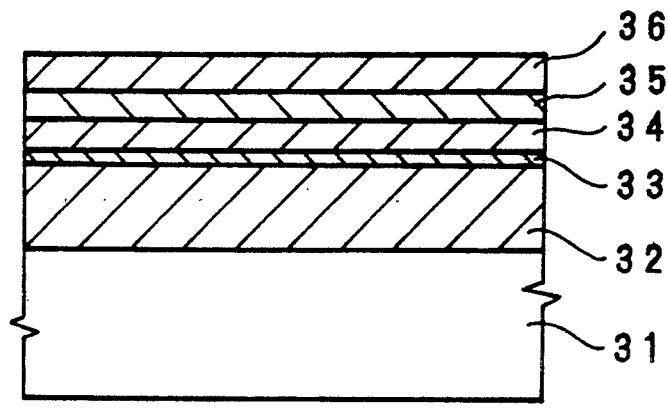
FIGS. 9A, 9B and 9C are sectional views of processing steps showing a method of producing a FET with reference to the first and the second embodiments as shown in FIG. 8.
Figure 9B:
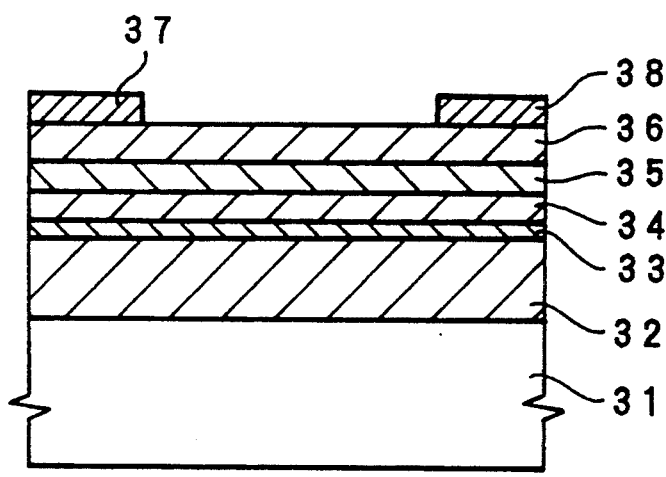
Figure 9C:
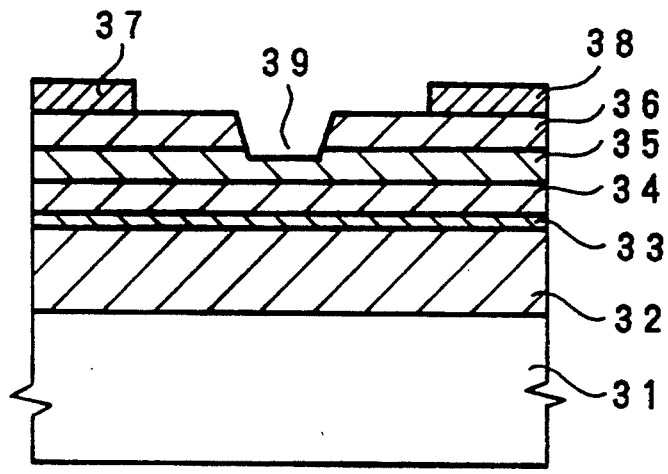

On a semi-insulative InP semiconductor substrate 31 there are sequentially epitaxially grown a first semiconductor layer 32, a channel layer 33, a second semiconductor layer 34, a third semiconductor layer 35, and a contact layer 36 (see FIG. 9A). The epitaxial growth is carried out by an MBE (molecular beam epitaxy) method or an OMVPE (organic metal vapor phase epitaxy) method.

The first semiconductor layer 32 is made of undoped InP with thickness of 1 μm. The channel layer 33 is made of n+ type InP doped by Si at a concentration of $2 \times 10^{18}/cm^3$, the thickness being 100 Å. The second semiconductor layer 34 is made of undoped InP with a thickness of 200 Å and having a higher electron carrying characteristic than the channel layer 33. The third semiconductor layer 35 is made of undoped $Al_xIn_{x-1}As$ having a thickness of 200 Å with an Al composition ratio X of 0.4 or more and 0.6 or less ($0.4 \leq X \leq 0.6$). The contact layer 36 is made of n+ type InGaAs having a thickness of 500 Å with donors doped at a concentration of $4 \times 10^{18}/cm^3$.

Here the channel layer 33 has carrier density and thickness enough to form a quantum well that will be described later. Electrons within the channel layer 33 have energy, therefore they exist in a slightly more expanded region than the thickness of the channel layer 33. In view of this, the second semiconductor layer 34 disposed on the channel layer 33 has a thickness allowing the expanded region of the electrons may not reach the third semiconductor layer 35.

Figure 10:
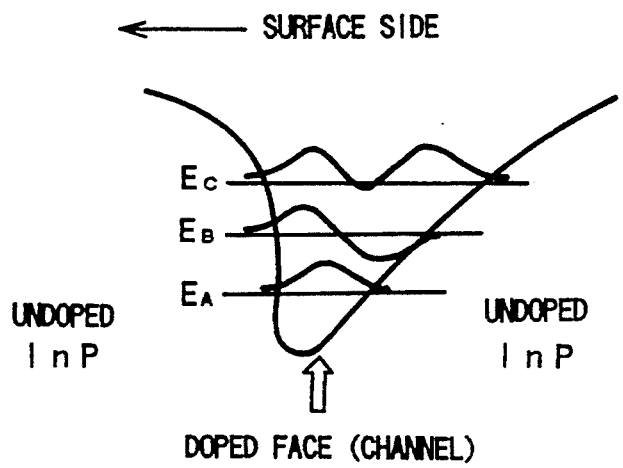
FIG. 10 shows an energy band adjacent to a channel of the FET with reference to the first embodiment.

That is, the energy band adjacent with the channel of the first semiconductor layer 32, the channel layer 33, and the second semiconductor layer 34 will take a structure as shown in FIG. 10. The drawing on its left shows the surface of the substrate, and the center portion corresponds to a channel doping surface. The channel layer 33 having higher density with thinner structure is sandwitched on its both sides by the semiconductor layers 32 and 34, the thickness being as thin as 100 Å, a conducting band produces a bent portion to form a V like potential to form a quantum well as shown in the drawing. Incidentally, the channel layer 33 is made to have a thickness of 100 Å, but for forming the quantum well on the conducting band, the channel layer may preferably have a certain specific thinness, for example, 200 Å or less.

The electrons in the channel layer when being at a ground state exist in the lowest subband $E_A$. By obtaining energy when an electric field is applied, the electrons are sequentially transferred to a second subband $E_B$ and a third subband $E_C$ positioned above the subband $E_A$, and move successively to higher energy leveled subbands.

An existential probability of electrons represents expansion of a wave function at the respective subbands as in FIG. 10, and approximates zero at the slightly more expanded portion than the thickness of the channel layer 33. The undoped InP layer at the substrate surface or the second semiconductor layer 34 has a thickness such that the electrons existing in the expanded region may not reach the third semiconductor layer 35.

The third semiconductor layer 35 is formed by Schottky contact with the gate electrode to be described later (see FIG. 9A). The semiconductor layer 35 has a thickness enough to prevent the current flowing from the gate electrode to the second semiconductor 34 by a tunnel effect. The third semiconductor layer 35, the second semiconductor layer 34, and the channel layer 33, while their respective thickness satisfies the conditions relating to layer thickness hereinbefore described, provide a total thickness of such layers thin enough to satisfy operational characteristic of the FET. Such total thickness may preferably be 500 Å or less. The topmost contact layer 36 is to protect the substrate surface and to take ohmic-contact with the drain and source electrodes as hereinafter described and has no relation with the essence of the invention.

After such layers are sequentially formed on the semiconductor substrate 31, the topmost contact layer 36 is formed thereon with AuGe/Ni metal. Next, an ohmic electrode pattern is formed using an ordinary photolithography technique, and a drain electrode 37 and a source electrode 38 ohmic-contacting with the contact layer 36 are formed (see FIG. 9B). The contact layer 36 centered between the drain electrode 37 and the source electrode 38 is selectively removed by etching, to form a recess 39 (see FIG. 9C).

Next there is formed a gate electrode 40 made of Ti/Pt/Au metal in Schottky contact with the third semiconductor layer 35 being exposed at the recess 39. As a result a FET is completed having a structure as shown in FIG. 8.

In the structure aforementioned, with voltage applied across the drain electrode 37 and source electrode 38, an electric field is applied on electrons in the channel layer 33. The electrons distributed in the subband $E_A$ move to the higher energy level subband $E_B$ by the energy given by the applied electric field. In the subband $E_A$ at the lowest position, the existential probability of electrons is high at the center portion of the channel layer 33 as shown by the expansion of the wave function in FIG. 10, electron speed is thereby lowered largely affected by the scattering of impurity. However, in the subbands $E_B$ and $E_C$ above the subband $E_A$, the existential probability of electrons has a peak value shifted from the center portion as shown in the drawing, thus being hardly affected by the scattering of impurity. As a result, the travelling speed of electrons in the channel layer 33 distributed in the subbands $E_B$ and $E_C$ with higher energy levels becomes increased.

When voltage applied across the drain and source is increased, a further higher electric field is applied to the electrons in the channel layer 33. Thus the electrons sequentially move to a even higher energy level subband to finally rush out from V shape potential into the first semiconductor 32 and second semiconductor 34 both sandwiching the channel layer 33. In this process, the amount of electrons rushing out is far greater in the second semiconductor layer 34 disposed on the channel layer 33, which allows the electrons to mostly travel in that second semiconductor layer 34. The layers 32 and 34 sandwiching the channel layer 33 are undoped and in addition a higher electron carrying characteristic is given to the second semiconductor layer 34 therefore it becomes the essential passage of the electrons. Thus even when a highly doped channel layer 34 easily affected by impurity scattering is used, although the mobility of electrons is lower under low electric field compared with conventional HEMT, a high frequency characteristic is exhibited equivalent to or higher than that of HEMT in actual operation of the device under a high electric field.

Also in the FET according to the present embodiment, the third semiconductor layer 35 and the channel layer 33 made of AlInAs are positioned at intervals more than a distance of the expansion of the wave function of the electrons in the channel layer 33 as described above. For this reason, deterioration of the high-frequency carrying characteristic due to the actual space transition does not arise like the conventional first HEMT as hereinbefore described in which the AlInAs layer having an inferior electron carrying characteristic and the channel layer made of InP both are in close vicinity with each other. In the conventional first HEMT a mutual conductance characteristic $g_m$ against change of a gate voltage $V_g$ had a peak of value $g_m$ for a certain specific gate voltage value. However, in the mutual conductance characteristic in this embodiment, a peak of value $g_m$ is maintained for the change of the gate voltage within a certain variation range. Therefore according to the embodiment, the designing of FET becomes easier and with a stable FET characteristic made possible to be obtained, a higher gain can be always secured, thus resulting in an output without distortion.

The channel layer 33 has thickness of a certain extent and has a structure being possible to dope impurity at a higher concentration, therefore the channel is formed of a large amount of electrons. This permits a far more excellent current drive capability compared with the conventional first HEMT wherein the current drive capability is limited by the upper limit of concentration of the two-dimensional electron gas.

The gate electrode 40 is in Schottky contact with the third semiconductor layer 35 made of undoped AlInAs. This makes a Schottky barrier higher and enables to operate the device at higher-bias condition, resulting in improved output characteristic. Furthermore, the noise reduction performance is improved because of higher speed of the electrons travelling in the channel.

Therefore, the FET of the embodiment is effective when applied to a basic structure of super high frequency, high output elements with low noise.

In the first embodiment, it has been explained that the third semiconductor layer 35 made of AlInAs is formed on the second semiconductor layer 34 made of InP. However, it is generally considered as difficult to maintain a good interface crystallinity between AlInAs and InP. For this reason, an undoped InGaAs thin layer may be formed between the second semiconductor layer 34 and the third semiconductor layer 35 which will exhibit the same result as the embodiment described above.

It also has been explained that the first and second semiconductor layers 32 and 34 sandwiching the channel layer 33 are to be undoped InP. However it is not necessarily limited to such material. Other materials may be employed for example, the undoped InGaAs having a higher electron carrying characteristic with a crystalline structure substantially lattice-matching the channel layer 33 which will exhibit the same effect as the embodiment abovementioned. Further, because the electrons forming the channel essentially travel in the second semiconductor layer 34, the first semiconductor layer 32 does not always have to be the same material as the second semiconductor layer 34 and may be a material having a crystalline structure substantially lattice-matching the semiconductor substrate 31 and the channel layer 33.

The present invention is now described for a FET according to a second embodiment. A structure of the FET of the second embodiment is similar to the FET of the first embodiment as shown in FIG. 8. A method of producing the same is also similar to the first embodiment and is produced through the same producing process in FIG. 9. A difference between the FETs of the first and second embodiments is the difference in materials forming the respective layers.

In this embodiment, a semi-insulative GaAs semiconductor substrate is used instead of the semi-insulative InP semiconductor substrate 31, the respective layers hereinafter described being sequentially and epitaxially grown on the semi-insulative GaAs semiconductor substrate.

The first semiconductor layer 32 made of the undoped InP is replaced by a new first semiconductor layer which is made of substantially undoped p⁻ type GaAs with thickness of 1 μm the same as that of the previous first semiconductor layer 32. The substantially undoped state may preferably mean an impurity concentration of $5 \times 10^{17}/cm^3$ or less. The channel layer 33 made of the n⁺ type InP is replaced by a new channel layer, which is formed of n⁺ type GaAs doped with Si at a concentration of $2 \times 10^{18}/cm^3$ having the same thickness of 100 Å as the former channel layer 33. The second semiconductor layer 34 made of undoped InP is replaced by a new second semiconductor layer, which is made of substantially undoped n⁻ type GaAs having a higher electron carrying characteristic than that of the channel layer and having a thickness of 200 Å the same as the former second semiconductor layer 34. The third semiconductor layer 35 made of undoped AlInAs is replaced by a new third semiconductor layer, which is made of substantially undoped n⁻ type $Al_xGa_{1-x}As$ having composite ratio X of Al of above zero and 0.3 or less ($0 < X \leq 0.3$) with thickness of 200 Å the same as that of the third semiconductor layer 35. The contact layer 38 made of the n+ type InGaAs is replaced by a new contact layer, which is made of n+ type GaAs doped with donors at a concentration of $4 \times 10^{18}/\text{cm}^3$ with thickness of 500 Å the same as that of the former contact layer 36. A gate electrode and an ohmic electrode are formed of the same materials as those of the first embodiment.

Figure 11:
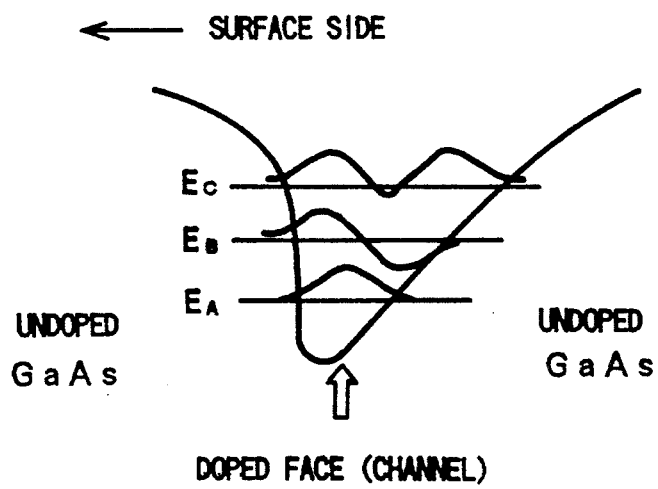
FIG. 11 shows an energy band adjacent to a channel of the FET with reference to the second embodiment.

An energy band adjacent to a channel of the FET according to the second embodiment has a structure the same as the first embodiment as shown in FIG. 11. Also in this second embodiment, the channel layer being made of the n+-GaAs having a high concentration and formed in thin layer, the both sides of the channel layer are sandwiched by the first and second semiconductor layers made of substantially undoped GaAs with a thickness as thin as 100 Å. Thus a bent portion is produced in a conduction band to form a V shape potential to make up a quantum well shown in the drawing. The electrons in the n+-GaAs channel in the embodiment also move sequentially to a higher energy level subbands by obtaining energy by an electric field being applied.

In the second embodiment, as in the first embodiment, in the higher energy level subbands EB and EC the peak of existential probability of electrons is shifted from the center portion, therefore the electrons in the channel layer are hardly affected by scattering of impurity, resulting in a higher travelling speed of the electrons.

If voltage applied across the drain/source is increased, the electrons in the channel layer finally rush out from the V shape potential into the first and second semiconductor layers made of substantially undoped GaAs and sandwiching the channel layer. In this process, the amount of electrons rushing out is far greater in the second semiconductor layer excelling o in carrying characteristic which is disposed on the channel layer, and hence as in the first embodiment the electrons in the channel layer become travelling at high speed. Therefore also in the second embodiment, even when a highly doped channel layer made of n+ type GaAs which is easily affected by scattering of impurity is used, although the electron mobility is low under a low electric field compared with a conventional HEMT, a high frequency characteristic equivalent to or more satisfactory than that of the HEMT is exhibited under the higher electric field in which the device is actually operated.

Also in the FET of the second embodiment, the third semiconductor layer made of AlGaAs and the channel layer made of GaAs are positioned at interval of a distance more than the expansion of the wave function of the electrons in the channel layer. Thus a deterioration of high-frequency characteristic due to the actual space transition is not produced like the conventional second HEMT or DMT having a structure where the AlGaAs layer with an inferior carrying characteristic of electrons is in close vicinity with the channel layer. The mutual conductance characteristic of FET in this second embodiment, also has a characteristic to maintain a peak value $g_m$ for a change of the gate voltage limited within a certain variation range. Therefore also in the second embodiment, the designing of FET is made easier and the obtained FET characteristic being stable to always secure a higher gain, an output without distortion can be obtained.

Because the channel layer formed of the n+ type GaAs has a thickness of a certain extent the channel layer can be doped with impurity at high concentration, therefore in the second embodiment also the channel is formed of a large amount of electrons. Thus, a far superior current drive capability can be obtained comparing with the conventional second HEMT where the current drive capability is limited by the upper limit of concentration of the two-dimensional electron gas.

In addition the gate electrode being in Schottky contact with the third semiconductor layer made of substantially undoped AlGaAs, also in the second embodiment the Schottky barrier becomes higher. In view of this, the device can be operated under the condition of a large bias, resulting in upgraded output characteristic. The noise reduction characteristic also is improved because of a higher electron speed travelling in the channel.

The FET according to the second embodiment also is effective when applied to the basic structure of super high frequency, high output elements with lower noise.

Incidentally, it has explained in the second embodiment that the first and second semiconductors sandwiching the channel layer are to be undoped GaAs, however it is not necessarily limited to such material. Other materials may be employed, for example, an undoped InGaAs having a higher electron carrying characteristic with a crystalline structure substantially lattice-matching the channel layer which will exhibit the same effect as the second embodiment mentioned above. Furthermore, because the electrons forming the channel essentially travel in the second semiconductor layer made of substantially undoped GaAs, the first semiconductor layer does not necessarily have to be of the same material as the second semiconductor layer and may have a crystalline structure substantially lattice-matching the GaAs substrate and the n+ type GaAs channel layer.

Figure 12:
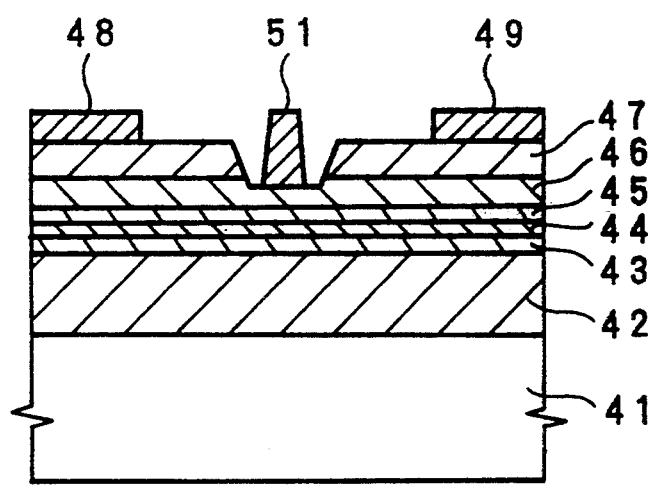
FIG. 12 is a sectional view of a FET with reference to the third and the fourth embodiments according to the present invention.

The present invention is now described for a FET according to a third embodiment. FIG. 12 shows a structure of the FET according to the third embodiment of the present invention. A method of producing the same is shown in sectional views of a production process in FIG. 13. The method of producing in this case is as follows.

Figure 13A:
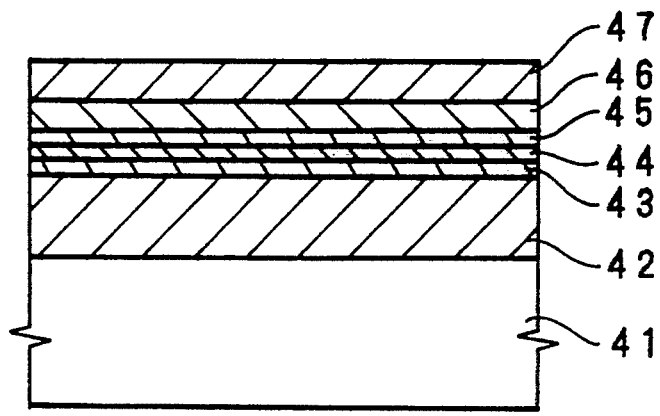
FIGS. 13A, 13B and 13C are sectional views of processing steps showing a method of producing a FET with reference to the third and the fourth embodiments as shown in FIG. 12.
Figure 13B:
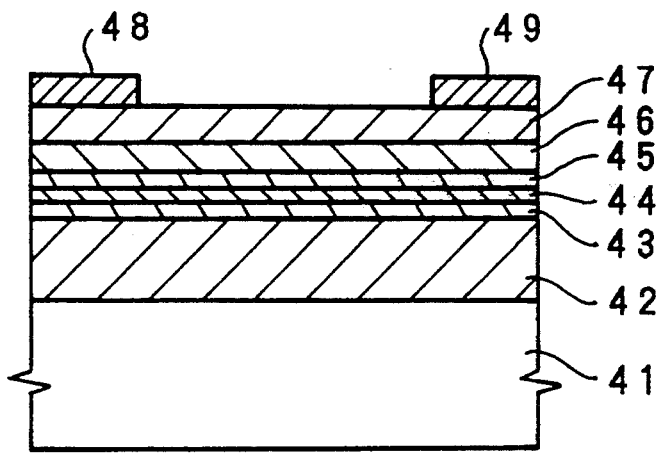
Figure 13C:
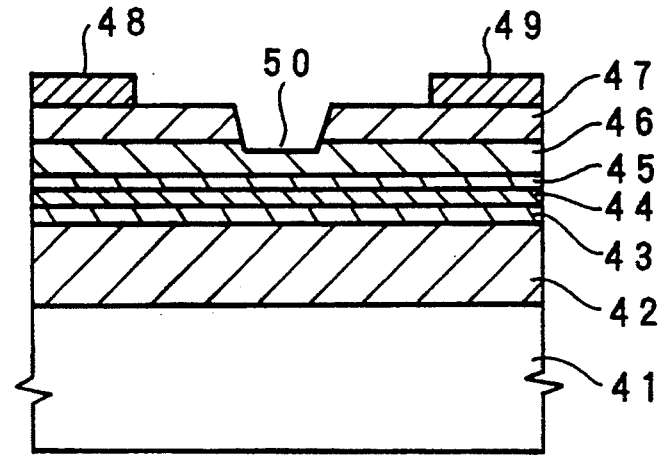

On a semi-insulator InP semiconductor substrate 41 there are sequentially and epitaxially grown a buffer layer 42 for lattice-matching the substrate 41, a first semiconductor layer 43, a channel layer 44, a second semiconductor layer 45, a third semiconductor layer 46, and a contact layer 47 (see FIG. 13A). This epitaxial growth is carried out by the MBE method or OMVPE method as in the respective embodiments abovementioned.

The buffer layer 42 for lattice-matching the substrate 41 is made of undoped AlInAs with a thickness of 1 μm. The first semiconductor layer 43 made of undoped $In_yGa_{1-y}As$ having a composition ratio Y of In of 0.45 or more and 0.65 or less ($0.45 \leq Y \leq 0.65$) and a thickness of 100 Å. The channel layer 44 is made of n+ type $In_yGa_{1-y}As$ ($0.45 \leq Y \leq 0.65$) doped with Si at a concentration of $2 \times 10^{18}/\text{cm}^3$ with a thickness of 100 Å. The second semiconductor layer 45 is made of undoped $In_yGa_{1-y}As$ ($0.45 \leq Y \leq 0.65$) having a thickness of 100 Å and a higher electron carrying characteristic than that of the channel layer 44. The third semiconductor layer 46 is made of undoped $Al_xIn_{1-x}As$ having a composition ratio X of Al of 0.4 or more and 0.6 or less ($0.4 \leq X \leq 0.6$) and a thickness of 200 Å. The contact layer 47 is made of n+ type InGaAs doped with donors at a concentration of $4\times 10^{18}/cm^3$ with a thickness of 500 Å.

Here, the channel layer 44 has carrier density and thickness enough to form a quantum well as in the first and second embodiments as hereinbefore described. Because the electrons in the channel layer 44 have energy they exist in a region slightly more expanded than the thickness of the channel layer 44. For this reason, the second semiconductor layer 45 disposed on the channel layer 44 has a thickness allowing the expanded region of the electrons will not reach the third semiconductor layer 46.

Figure 14:
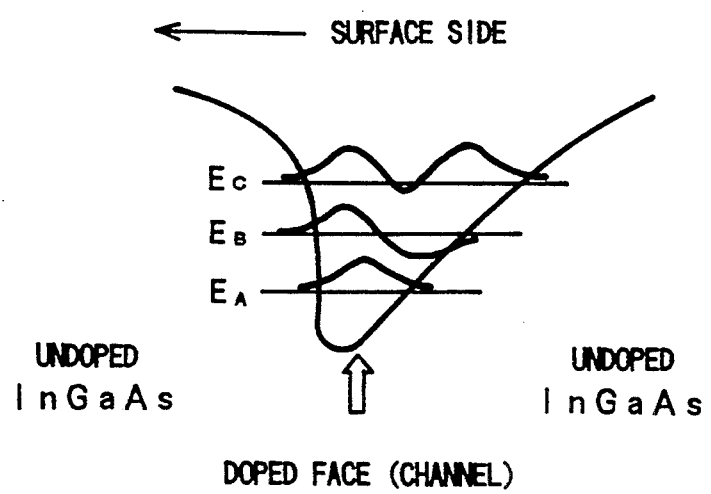
FIG. 14 shows an energy band adjacent to a channel of the FET with reference to the third and the fourth embodiments.

An energy band adjacent to a channel of the FET according to the third embodiment has a structure the same as the respective embodiments as shown in the FIG. 14. Also in this third embodiment, the channel layer 44 made of n+-$In_yGa_{1-y}As$ having a high concentration and thinly formed, both sides of the channel layer 44 are sandwiched by the first and second semiconductor layers 43 and 45 made of undoped $In_yGa_{1-y}As$ with a thickness of as thin as 100 Å. Thus a bent portion is formed in a conduction band to produce a V shape potential and to provide a quantum well as shown in the drawing. Also in the third embodiment, the thickness of the channel layer 44 is preferred to have a certain thinness enough to form a quantum well at the conduction band, for example, 200 Å or less. Also, the second semiconductor layer 45 has a thickness allowing the electrons expanded into the channel layer 44 not to reach the third semiconductor layer 46.

The gate electrode to be described later is formed by being in Schottky contact with the third semiconductor layer 46, which has a thickness enough to prevent the current flowing from the gate electrode to the second semiconductor layer 45 by a tunnel effect. The third semiconductor layer 46, the second semiconductor layer 45, and the channel layer 44 while satisfying the respective conditions relating to the layer thickness as abovementioned, the total thickness thereof is thin enough to satisfy the operational performance of the FET. Such total thickness may preferably be 500 Å or less. The contact layer 47 being the topmost layer is provided for protecting the substrate surface and for making ohmic contact with the drain/source electrodes. Hence that contact layer has no relation to the essence of the invention.

Next, after the respective layers have been sequentially formed on the semiconductor substrate 41 as hereinbefore described, AuGe/Ni metal is formed on the contact layer 47 being the topmost layer. An electrode pattern is formed using an ordinary photolithography technique, and a drain electrode 48 and a source electrode 49 are formed in ohmic contact with the contact layer 47 (see FIG. 13B). Next, the contact layer 47 centered between the drain electrode 48 and source electrode 49 is selectively removed by etching to form a recess 50 (see FIG. 13C).

In the next process, there is formed a gate electrode 51 made of Ti/Pt/Au in Schottky contact with the third semiconductor layer 46 exposed at the recess 50. As a result the FET having a structure as shown in FIG. 12 is completed.

Also in the present embodiment, the electrons in the channel layer 44 made of n+-$In_yGa_{1-y}As$ move successively to higher energy level subbands by obtaining energy from an electric field being applied. Therefore, also in this third embodiment, same as in the respective previous embodiments, because the peak of an existential probability of the electrons is being shifted from the center portion at the higher energy level subbands EB and EC, the electrons in the channel layer 44 are hardly affected by scattering of impurity, resulting in a higher travelling speed of the electrons.

If voltage applied across the drain/source is raised, the electrons in the channel layer 44 finally rush out from the V shape potential into the first and second semiconductor layers 43 and 45 made of undoped $In_yGa_{1-y}As$ sandwiching the channel layer 44. In this process, the amount of electrons rushing out is far greater in the second semiconductor layer 45 excelling in electron carrying characteristic and disposed on the channel layer 44, hence as in the respective embodiments hereinbefore described the electrons in the channel become travelling at a high speed. Therefore also in the third embodiment, even when a highly doped channel layer 44 made of the n+ type $In_yGa_{1-y}As$ easily affected by scattering of impurity is used, a high-frequency characteristic equivalent to or superior than that of the HEMT is exhibited under a higher electric field in which the device is actually operated, although the electron mobility at a low electric field is lower comparing with that of the conventional HEMT.

Also in the FET of the third embodiment, the third semiconductor layer 46 made of AlInAs and the channel layer 44 made of n+ type $In_yGa_{1-y}As$ are positioned at interval of a distance more than the expansion of the wave function of the electrons in the channel layer 44. Therefore a deterioration of high-frequency characteristic due to the actual space transition is not produced like the conventional third HEMT having a structure where the AlInAs layer with an inferior carrying characteristic of electrons is in close vicinity of the channel layer. Also in the mutual conductance characteristic of FET according to the third embodiment, it has a characteristic of a peak of $g_m$ value is maintained against the change of the gate voltage having a certain variation range. Therefore according to the third embodiment also, the designing of FET is easier and with a stable FET characteristic obtained, a higher gain is always secured, as a result an output without distortion is obtained.

The channel layer 44 formed of the n+ type $In_yGa_{1-y}As$ has a thickness of a certain extent so that the channel layer 44 can be doped with impurity at a high concentration, therefore in the third embodiment also the channel is formed of a large amount of electrons. Thus, far superior current drive capability can be obtained compared with the conventional third HEMT wherein the current drive capability is limited by the upper limit of concentration of the two-dimensional electron gas.

In addition, the gate electrode 51 being in Schottky contact with the third semiconductor layer 46 made of undoped AlInAs, in the third embodiment also the Schottky barrier becomes high. Therefore the device can thus be operated under the condition of high bias which upgrades the output characteristic. Furthermore the noise reduction characteristic also is improved because of a higher electron speed when travelling in the channel.

In view of above, the FET according to the third embodiment is effective if applied to the basic structure of elements requiring super-high frequency and large output with lowered noise.

It has been explained in the third embodiment that the first and second semiconductor layers 43 and 45 sandwiching the channel layer 44 to be an undoped InGaAs. However it is not necessarily limited to such material in this embodiment. Other materials may be employed, for example, the undoped InP having a higher electron carrying characteristic with a crystalline structure substantially lattice-matching the channel layer 44 which will exhibit the same effect as the third embodiment abovementioned. Furthermore, because the electrons forming the channel essentially travel in the second semiconductor layer 45 made of undoped InGaAs, the first semiconductor layer 43 does not necessarily have to be the same material as the second semiconductor layer 45 and it may be a material having a crystalline structure substantially lattice-matching the InP semiconductor substrate 41 and the n+ type InGaAs channel layer 44.

The present invention is now described for a FET according to a fourth embodiment. FIG. 12 also shows a structure of the FET according to the fourth embodiment of the present invention. A method of producing the same is similar to that of the third embodiment as shown in FIG. 13, and produced through similar processing steps as shown in FIG. 13. Difference between the FETs according to the fourth and third embodiments is the difference in materials forming respective layers.

A semi-insulative GaAs semiconductor substrate is used instead of the semi-insulative InP semiconductor substrate 41, and following layers are sequentially epitaxially grown on the semi-insulative GaAs semiconductor substrate.

The buffer layer 42 made of undoped AlInAs for lattice-matching the substrate 41 is replaced by another buffer layer which is made of undoped GaAs with a thickness of 1 μm the same as the former buffer layer 42. The first semiconductor layer 43 made of the undoped $In_yGa_{1-y}As$ ($0.45 \leq y \leq 0.65$) is replaced by a new first semiconductor layer, which is made of undoped $In_yGa_{1-y}As$ having a composition ratio "y" of In of zero or more and 0.35 or less ($0 \leq y \leq 0.35$) with a thickness of 50 Å. The channel layer 44 made of the n+ type $In_yGa_{1-y}As$ ($0.45 \leq y \leq 0.65$) is replaced by a new channel layer, which is made of n+ type $In_yGa_{1-y}As$ ($0 \leq y \leq 0.35$) doped with Si at a concentration of $2 \times 10^{18}/cm^3$ having a thickness of 100 Å the same as that of the former channel layer 44. The second semiconductor layer 45 made of the undoped $In_yGa_{1-y}As$ ($0.45 \leq y \leq 0.65$) is replaced by a new second semiconductor layer, which is made of undoped $In_yGa_{1-y}As$ ($0 \leq y \leq 0.35$) having a higher electron carrying characteristic than that of the channel layer and a thickness of 100 Å the same as the former second semiconductor layer 45. The third semiconductor layer 46 made of the undoped $Al_xIn_{1-x}As$ ($0.4 \leq X \leq 0.6$) is replaced by a new third semiconductor layer, which is made of undoped $Al_xGa_{1-x}As$ having a composition ratio X of Al of zero or more and 0.3 or less ($0 \leq x \leq 0.3$) and a thickness of 200 Å the same as that of the former third semiconductor 46.

Also, a new contact layer is formed with the same materials and thickness as those of the former contact layer 47 made of the n+ type InGaAs. A gate electrode and an ohmic electrode are formed in likewise manner and with the same materials as those of the third embodiment.

An energy band adjacent to a channel of the FET according to the fourth embodiment has a structure the same as the third embodiment as hereinbefore described in FIG. 14. Also in this fourth embodiment, the channel layer made of high concentration and thinly formed n+-$In_yGa_{1-y}As$ layer, both sides of the channel layer are sandwiched by the first and second semiconductor layers made of the undoped $In_yGa_{1-y}As$ and formed thinly to a thickness of 100 Å. Thus a bent portion is produced in a conduction band to form a V shape potential and to provide a quantum well shown in the drawing. In the present embodiment, the electrons in the channel layer made of n+-$In_yGa_{1-y}As$ also move successively to a plurality of higher energy level subbands by obtaining energy from an electric field being applied. Therefore in the fourth embodiment also, as in the respective previous embodiments, since the peak of an existential probability of the electrons is shifted from the center portion at the higher energy level subbands EB and EC, the electrons in the channel layer is hardly affected by scattering of impurity, thus resulting in a higher travelling speed of electrons.

If voltage impressed across the drain/source is raised, the electrons in the channel layer finally rush out from the V shape potential into the first and second semiconductor layers made of undoped $In_yGa_{1-y}As$ sandwiching the channel layer. In this process, the amount of electrons rushing out is far greater in the second semiconductor layer excelling in electron carrying characteristic and disposed on the channel layer, as in the respective embodiments hereinbefore described, and the electrons in the channel become travelling at a high speed. Therefore also in the fourth embodiment even when a highly doped channel layer made of n+ type $In_yGa_{1-y}As$ easily affected by scattering of impurity is used, a high-frequency characteristic equivalent to or superior than that of the HEMT is exhibited under high electric field in which the device is actually operated although the electron mobility at a low electric field is lower comparing with that of the conventional HEMT.

Also in the FET of the fourth embodiment, the third semiconductor layer made of AlGaAs and the channel layer made of the n+ type $In_yGa_{1-y}As$ are positioned at interval of a distance more than the expansion of the wave function of the electrons in the channel layer. Thus a deterioration of high-frequency characteristic due to the actual space transition is not produced like the conventional fourth HEMT having a structure where the AlGaAs layer with inferior carrying characteristic of electrons is in close vicinity with the channel layer. The mutual conductance characteristic of FET according to the fourth embodiment, also has a characteristic of a peak of value of $g_m$ is maintained against the change of the gate voltage having a certain variation range. Therefore also by the fourth embodiment, the designing of FET is made easier and with a stable FET characteristic obtained, a higher gain is always secured, thus resulting in an output without distortion.

The channel layer formed of the n+ type $In_yGa_{1-y}As$ has a thickness of certain extent so that the channel layer can be doped with impurity at a high concentration, hence also in the fourth embodiment the channel is formed of a large amount of electrons. Thus, far superior current drive capability can be obtained comparing with the conventional fourth HEMT wherein the current drive capability is limited by the upper limit of concentration of the two-dimensional electron gas.

The gate electrode being in Schottky contact with the third semiconductor layer made of undoped AlGaAs, the Schottky barrier in the fourth embodiment also becomes high. The device can thus be operated under a high bias condition which upgrades the output characteristic. The noise reduction characteristic also is improved because the travelling speed of electron in the channel becomes higher.

The FET according to the fourth embodiment is effective when applied to the basic structure using elements requiring a super high-frequency and large output with lowered noise.

In the fourth embodiment it has explained that the first and second semiconductor layers sandwiching the channel layer are to be undoped InGaAs. However it is not necessarily limited to such material. Other materials may be employed, for example, the undoped GaAs having a higher electron carrying characteristic with a crystalline structure substantially lattice-matching the channel layer which will exhibit the same effect as the fourth embodiment described above. Furthermore, because the electrons forming the channel essentially travel in the second semiconductor layer made of undoped InGaAs, the first semiconductor layer does not have to be necessarily the same material as the second semiconductor layer and it may have a crystalline structure substantially lattice-matching the GaAs semiconductor substrate and the n+ type InGaAs channel layer.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A field effect transistor comprising:
   a first semiconductor layer;
   a n conductivity type channel layer made of n+ type InP formed on said first semiconductor layer to be substantially lattice-matched with said first semiconductor layer and containing a high concentration of an impurity, the impurity causing said channel layer to be of n type conductivity;
   a second semiconductor layer formed on said channel layer to be substantially lattice-matched with said channel layer and containing substantially no impurity;
   a third semiconductor layer made of $Al_xIn_{1-x}As$, where $0.4 \leq X \leq 0.6$, formed on said second semiconductor layer, said third semiconductor layer being substantially lattice-matched and forming a heterojunction with said second semiconductor layer, said third semiconductor layer containing substantially no impurity; and
   a gate electrode being in Schottky contact with said third semiconductor layer.

2. A field effect transistor according to claim 1, wherein
   said first semiconductor layer is made of substantially undoped InP, and
   said second semiconductor layer is made of substantially undoped InP.

3. A field effect transistor according to claim 1, wherein
   said first semiconductor layer is made of substantially undoped InGaAs, and
   said second semiconductor layer is made of substantially undoped InGaAs.

4. A field effect transistor comprising:
   a first semiconductor layer made of substantially undoped InP;
   a n conductivity type channel layer made of n+ type InP, formed on said first semiconductor layer to be substantially lattice-matched with said first semiconductor layer and containing a high concentration of an impurity, the impurity causing said channel layer to be of n type conductivity;
   a second semiconductor layer made of substantially undoped InP, and formed on said channel layer to be substantially lattice-matched with said channel layer;
   a third semiconductor layer formed on said second semiconductor layer, said third semiconductor layer being substantially lattice-matched and forming a heterojunction with said second semiconductor layer, said third semiconductor layer containing substantially no impurity, said third semiconductor layer including:
      an undoped InGaAs film formed on said second semiconductor layer; and
      an undoped $Al_xIn_{1-x}As$ layer, where $0.4 \leq X \leq 0.6$, formed on said undoped InGaAs film; and
   a gate electrode being in Schottky contact with said third semiconductor layer.

5. A field effect transistor comprising:
   a first semiconductor layer made of substantially undoped $p^-$ type InGaAs;
   a $n^+$ type GaAs channel layer formed on said first semiconductor layer to be substantially lattice-matched with said first semiconductor layer and containing a high concentration of an impurity, the impurity causing said channel layer to be of n type conductivity;
   a second semiconductor layer made of substantially undoped $n^-$ type InGaAs formed on said channel layer to be substantially lattice-matched with said channel layer and containing substantially no impurity;
   a third semiconductor layer made of substantially undoped $Al_xGa_{1-x}As$, where $0<X<0.3$, said third semiconductor layer being substantially lattice-matched and forming a heterojunction with said second semiconductor layer.

6. A field effect transistor comprising:
   a first semiconductor layer;
   an conductivity type channel layer made of n+ type $In_yGa_{1-y}As$, where $0.45 \leq X \leq 0.65$, and formed on said first semiconductor layer to be substantially lattice-matched with said first semiconductor layer and containing a high concentration of an impurity, the impurity causing said channel layer to be of n type conductivity;
   a second semiconductor layer formed on said channel layer to be substantially lattice-matched with said channel layer and containing substantially no impurity;
   a third semiconductor layer made of substantially undoped $Al_xIn_{1-x}As$, where $0.4 \leq X \leq 0.6$, and formed on said second semiconductor layer, said third semiconductor layer being substantially lattice-matched and forming a heterojunction with said second semiconductor layer; and
   a gate electrode being in Schottky contact with said third semiconductor layer.

7. A field effect transistor according to claim 6, wherein said first semiconductor layer is made of substantially undoped InP, and said second semiconductor layer is made of substantially undoped InP.

8. A field effect transistor according to claim 6, wherein said first semiconductor layer is made of substantially undoped $In_yGa_{1-y}As$, where $0.45 \leq Y \leq 0.65$, and said second semiconductor layer made of substantially undoped $In_yGa_{1-y}As$.

9. A field effect transistor comprising:

a first semiconductor layer;

a n conductivity type channel layer made of $n^+$ type $In_yGa_{1-y}As$, where $0 \leq Y \leq 0.35$, and formed on said first semiconductor layer to be substantially lattice-matched with said first semiconductor layer and containing a high concentration of an impurity, the impurity causing said channel layer to be of n type conductivity;

a second semiconductor layer formed on said channel layer to be substantially lattice-matched with said channel layer and containing substantially no impurity;

a third semiconductor layer made of substantially undoped $Al_xGa_{1-x}As$, where $0 \leq X \leq 0.3$ formed on said second semiconductor layer, said third semiconductor layer being substantially lattice-matched and forming a heterojunction with said second semiconductor layer; and a gate electrode being in Schottky contact with said third semiconductor layer.

10. A field effect transistor according to claim 9, wherein said first semiconductor layer is made of substantially undoped GaAs, and said second semiconductor layer is made of substantially undoped GaAs.

11. A field effect transistor according to claim 9, wherein said first semiconductor layer is made of substantially undoped $In_yGa_{1-y}As$, where $0 \leq y \leq 0.35$, and said second semiconductor layer is made of substantially undoped $In_yGa_{1-y}As$.

12. A field effect transistor comprising:

a first semiconductor layer;

a channel layer formed on said first semiconductor layer and being made of $n^+$ type InP doped with an impurity at a high concentration, and being substantially lattice-matched with said first semiconductor layer;

a second semiconductor layer formed on said channel layer and being made of substantially undoped semiconductor material and being substantially lattice-matched with said channel layer;

a third semiconductor layer formed on said second semiconductor layer and being made of substantially undoped $Al_xIn_{1-x}As$, where $(0.4 \leq X \leq 0.6)$, and being substantially lattice-matched with said second semiconductor layer to form a heterojunction therewith; and a gate electrode being in Schottky contact with said third semiconductor layer.

13. A field effect transistor according to claim 12, further comprising:

a semi-insulative InP semiconductor substrate;

a contact layer made of $n^+$ type InGaAs formed on said third semiconductor layer; and an ohmic electrode formed on said contact layer, and wherein said first semiconductor layer is formed on said semi-insulative InP semiconductor substrate and is made of substantially undoped InP;

said channel layer is made of $n^+$ type InP doped with Si;

said second semiconductor layer is made of substantially undoped InP; and said gate electrode in Schottky contact with said third semiconductor layer, is exposed on a recess formed on said contact layer and said third semiconductor layer.

14. A field effect transistor according to claim 12, further comprising:

a semi-insulative InP semiconductor substrate;

a contact layer made of $n^+$ type InGaAs formed on said third semiconductor layer; and an ohmic electrode formed on said contact layer, and wherein said first semiconductor layer is formed on said semi-insulative InP semiconductor substrate and is made of substantially undoped InGaAs;

said channel layer is made of $n^+$ type InP doped with Si;

said second semiconductor layer is made of substantially undoped InGaAs; and said gate electrode in Schottky contact with said third semiconductor layer, is exposed on a recess formed on said contact layer and said third semiconductor layer.

15. A field effect transistor comprising:

a semi-insulative InP semiconductor substrate;

a first semiconductor layer formed on said semi-insulative InP semiconductor substrate and made of substantially undoped InP;

a channel layer formed on said first semiconductor layer and being made of $n^+$ type InP doped with Si at a high concentration and being substantially lattice-matched with said first semiconductor layer;

a second semiconductor layer formed on said channel layer and being made of substantially undoped InP and being substantially lattice-matched with said channel layer;

an undoped InGaAs layer formed on said second semiconductor layer;

a third semiconductor layer formed on said undoped InGaAs layer and being made of substantially undoped $Al_xIn_{1-x}As$, where $0.4 \leq X \leq 0.6$, and being substantially lattice-matched with said second semiconductor layer to form a heterojunction therewith;

a contact layer made of $n^+$ type InGaAs formed on said third semiconductor layer;

a gate electrode in Schottky contact with a portion of said third semiconductor layer exposed in a recess formed in said contact layer and said third semiconductor layer; and an ohmic electrode formed on said contact layer.

16. A field effect transistor comprising:

a semi-insulative GaAs semiconductor substrate;

a first semiconductor layer formed on said semi-insulative GaAs semiconductor substrate and made of substantially undoped $p^-$ type GaAs;

a channel layer formed on said first semiconductor layer and being made of $n^+$ type GaAs doped with Si at a higher concentration than and being substantially lattice-matched with said first semiconductor layer;

a second semiconductor layer formed on said channel layer and being made of substantially undoped n⁻ type GaAs and being substantially lattice-matched with said channel layer;

a third semiconductor layer formed on said second semiconductor layer and being made of substantially undoped n⁻ type $Al_xGa_{1-x}As$, where $0 \leq X \leq 0.3$, and being substantially lattice-matched with said second semiconductor layer to form a heterojunction therewith, and containing substantially no impurity;

a contact layer made of n+ type GaAs formed on said third semiconductor layer;

a gate electrode in Schottky contact with a portion of said third semiconductor layer exposed in a recess formed in said contact layer and said third semiconductor layer; and an ohmic electrode formed on said contact layer.

17. A field effect transistor comprising:
a semi-insulative GaAs semiconductor substrate;
a first semiconductor layer formed on said semi-insulative GaAs semiconductor substrate and made of substantially undoped p⁻ type InGaAs;
a channel layer formed on said first semiconductor layer and being made of n+ type GaAs doped with Si at a higher concentration than and being substantially lattice-matched with said first semiconductor layer;
a second semiconductor layer formed on said channel layer and being made of substantially undoped n⁻ type InGaAs and being substantially lattice-matched with said channel layer;
a third semiconductor layer formed on said second semiconductor layer and being made of substantially undoped n⁻ type $Al_xGa_{1-x}As$, where $0 \leq X \leq 0.3$, and being substantially lattice-matched with said second semiconductor layer to form a heterojunction therewith;
a contact layer made of n+ type GaAs formed on said third semiconductor layer;
a gate electrode in Schottky contact with a portion of said third semiconductor layer exposed in a recess formed in said contact layer and said third semiconductor layer; and
an ohmic electrode formed on said contact layer.

18. A field effect transistor comprising:
a first semiconductor layer;
a channel layer formed on said first semiconductor layer and being made of n+ type $In_yGa_{1-y}As$, where $0.45 \leq Y \leq 0.65$, and being substantially doped with an impurity at a higher concentration and being substantially lattice-matched with said first semiconductor layer;
a second semiconductor layer formed on said channel layer, and being made of substantially undoped semiconductor material and being substantially lattice-matched with said channel layer;
a third semiconductor layer formed on said second semiconductor layer and being made of substantially undoped $Al_xIn_{1-x}As$, where $0.4 \leq X \leq 0.6$, and being substantially lattice-matched with said second semiconductor layer to form a heterojunction therewith; and
a gate electrode being in Schottky contact with said third semiconductor layer.

19. A field effect transistor according to claim 18, further comprising:
a semi-insulative InP semiconductor substrate;
a buffer layer formed on said semi-insulative InP semiconductor substrate and being made of substantially undoped AlInAs and being lattice-matched with said semi-insulative InP semiconductor substrate;
a contact layer being made of n+ type InGaAs formed on said third semiconductor layer; and
an ohmic electrode formed on said contact layer, and wherein
said first semiconductor layer is formed on said buffer layer and is made of substantially undoped InP;
said channel layer is made of n+ type $In_yGa_{1-y}As$ doped with Si at a higher concentration;
said second semiconductor layer is made of substantially undoped InP;
said third semiconductor layer is made of substantially undoped $Al_xIn_{1-x}As$, where $0.4 \leq X \leq 0.6$;
said gate electrode in Schottky contact with a portion of said third semiconductor layer is exposed on a recess formed in said contact layer and said third semiconductor layer.

20. A field effect transistor comprising:
a semi-insulative GaAs semiconductor substrate;
a buffer layer being made of substantially undoped GaAs for lattice-matching said semi-insulative GaAs semiconductor substrate;
a first semiconductor layer made of substantially undoped $In_yGa_{1-y}As$, where $0 \leq Y \leq 0.35$, and formed on said buffer layer;
a channel layer formed on said first semiconductor layer and being made of n+ type $In_yGa_{1-y}As$, where $0 \leq Y \leq 0.35$, doped with Si at a higher concentration and being substantially lattice-matched with said first semiconductor layer;
a second semiconductor layer formed on said channel layer and being made of substantially undoped $In_yGa_{1-y}As$ and being substantially lattice-matched with said channel layer;
a third semiconductor layer formed on said second semiconductor layer and being made of substantially undoped $Al_xGa_{1-x}As$, where $0 \leq X \leq 0.3$, and being substantially lattice-matched with said second semiconductor layer to form a heterojunction therewith;
a contact layer being made of n+ type InGaAs formed on said third semiconductor layer; and
an ohmic electrode formed on said contact layer; and
a gate electrode being in Schottky contact with said third semiconductor layer which is exposed in a recess formed in said contact layer and said third semiconductor layer.

21. A field effect transistor comprising:
a semi-insulative GaAs semiconductor substrate;
a buffer layer being made of substantially undoped GaAs for lattice-making said semi-insulative GaAs semiconductor substrate;
a first semiconductor layer made of substantially undoped GaAs;
a channel layer formed on said first semiconductor layer and being made of n+ type $In_yGa_{1-y}As$, where $0 \leq Y \leq 0.35$, doped with Si at a higher concentration and being substantially lattice-matched with said first semiconductor layer;
a second semiconductor layer formed on said channel layer and being made of substantially undoped GaAs and being substantially lattice-matched with said channel layer;

a third semiconductor layer formed on said second semiconductor layer and being made of substantially undoped $Al_xGa_{1-x}As$, where $0 \leq X \leq 0.3$, and being substantially lattice-matched with said second semiconductor layer to form a heterojunction therewith;

a contact layer being made of $n^+$ type InGaAs formed on said third semiconductor layer;

an ohmic electrode formed on said contact layer; and a gate electrode in Schottky contact with said third semiconductor layer which is exposed in a recess formed in said contact layer and said third semiconductor layer.

* * * * *